US009054675B2

(12) United States Patent
Mazumder et al.

(10) Patent No.: US 9,054,675 B2
(45) Date of Patent: Jun. 9, 2015

(54) APPARATUSES AND METHODS FOR ADJUSTING A MINIMUM FORWARD PATH DELAY OF A SIGNAL PATH

(75) Inventors: Kallol Mazumder, Plano, TX (US); Jongtae Kwak, Boise, ID (US); Tsugio Takahashi, Tukuba (JP); Yasuo Satoh, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/531,341

(22) Filed: Jun. 22, 2012

(65) Prior Publication Data

US 2013/0342254 A1   Dec. 26, 2013

(51) Int. Cl.
*H03H 11/26* (2006.01)

(52) U.S. Cl.
CPC ..................... *H03H 11/26* (2013.01)

(58) Field of Classification Search
USPC .......................................... 327/276
See application file for complete search history.

(56) References Cited

U.S. PATENT DOCUMENTS

| 5,004,933 | A  | 4/1991  | Widener |
| 6,111,810 | A  | 8/2000  | Fujita |
| 6,219,384 | B1 | 4/2001  | Kliza et al. |
| 6,260,128 | B1 | 7/2001  | Ohshima et al. |
| 6,275,077 | B1 | 8/2001  | Tobin et al. |
| 6,424,592 | B1 | 7/2002  | Maruyama |
| 6,438,055 | B1 | 8/2002  | Taguchi et al. |
| 6,459,313 | B1 | 10/2002 | Godbee et al. |
| 6,489,823 | B2 | 12/2002 | Iwamoto |
| 6,510,095 | B1 | 1/2003  | Matsuzaki et al. |
| 6,636,110 | B1 | 10/2003 | Ooishi et al. |
| 6,687,185 | B1 | 2/2004  | Keeth et al. |
| 6,710,726 | B2 | 3/2004  | Kim et al. |
| 6,744,285 | B2 | 6/2004  | Mangum et al. |
| 6,781,861 | B2 | 8/2004  | Gomm et al. |
| 6,839,288 | B1 | 1/2005  | Kim et al. |
| 6,861,901 | B2 | 3/2005  | Prexl et al. |
| 6,914,798 | B2 | 7/2005  | Kwon et al. |
| 6,930,955 | B2 | 8/2005  | Johnson et al. |
| 6,973,008 | B2 | 12/2005 | Krause |
| 6,980,479 | B2 | 12/2005 | Park |
| 6,988,218 | B2 | 1/2006  | Drexler |
| 7,042,799 | B2 | 5/2006  | Cho |
| 7,046,060 | B1 | 5/2006  | Minzoni et al. |
| 7,058,799 | B2 | 6/2006  | Johnson |
| 7,061,941 | B1 | 6/2006  | Zheng |
| 7,065,001 | B2 | 6/2006  | Johnson et al. |

(Continued)

OTHER PUBLICATIONS

Related U.S. Appl. No. 13/543,698, filed Jul. 6, 2012.

(Continued)

*Primary Examiner* — Daniel Rojas
(74) *Attorney, Agent, or Firm* — Dorsey & Whitney LLP

(57) ABSTRACT

Apparatuses and methods related to adjusting a minimum forward path delay of a signal path are disclosed. One such signal path includes a signal path having a minimum forward path delay, wherein the signal path is configured to adjust the minimum forward path delay based at least in part on a selected latency and a propagation delay of the minimum forward path delay. An example method includes reducing a forward path delay of a command path by at least one clock cycle of a clock signal to provide a command according to a selected latency responsive to a count value representative of a minimum forward path delay of the command path being greater than a maximum count value for the selected latency.

32 Claims, 8 Drawing Sheets

(56) References Cited

U.S. PATENT DOCUMENTS

| | | |
|---|---|---|
| 7,111,185 B2 | 9/2006 | Gomm et al. |
| 7,119,591 B1 | 10/2006 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,336,752 B2 | 2/2008 | Vlasenko et al. |
| 7,340,632 B2 | 3/2008 | Park |
| 7,375,560 B2 | 5/2008 | Lee et al. |
| 7,411,852 B2 | 8/2008 | Nishioka et al. |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,885,365 B2 | 2/2011 | Hagleitner et al. |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,509,011 B2 | 8/2013 | Bringivijayaraghavan |
| 8,644,096 B2 | 2/2014 | Bringivijayaraghavan |
| 8,788,896 B2 | 7/2014 | Tekumalla |
| 9,001,955 B2 | 4/2015 | Lamanna et al. |
| 2001/0015924 A1 | 8/2001 | Arimoto et al. |
| 2002/0057624 A1 | 5/2002 | Manning |
| 2003/0117864 A1 | 6/2003 | Hampel et al. |
| 2005/0024107 A1* | 2/2005 | Takai et al. ............ 327/158 |
| 2005/0047222 A1 | 3/2005 | Rentschler |
| 2005/0132043 A1 | 6/2005 | Wang et al. |
| 2005/0270852 A1 | 12/2005 | Dietrich et al. |
| 2006/0062341 A1 | 3/2006 | Edmondson et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1* | 8/2007 | Schoch ............ 713/600 |
| 2007/0291558 A1 | 12/2007 | Joo |
| 2008/0080267 A1 | 4/2008 | Lee |
| 2008/0080271 A1 | 4/2008 | Kim |
| 2008/0082707 A1 | 4/2008 | Gupta et al. |
| 2008/0137471 A1 | 6/2008 | Schnell et al. |
| 2008/0144423 A1 | 6/2008 | Kwak |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0066422 A1 | 3/2010 | Tsai |
| 2010/0124090 A1 | 5/2010 | Arai |
| 2010/0124102 A1 | 5/2010 | Lee et al. |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0199117 A1 | 8/2010 | Kwak |
| 2010/0232213 A1 | 9/2010 | Hwang et al. |
| 2010/0254198 A1 | 10/2010 | Bringivijayaraghavan et al. |
| 2011/0047319 A1 | 2/2011 | Jeon et al. |
| 2011/0055671 A1 | 3/2011 | Kim et al. |
| 2011/0102039 A1 | 5/2011 | Shin |
| 2011/0228625 A1 | 9/2011 | Bringivijayaraghavan et al. |
| 2011/0238866 A1 | 9/2011 | Zitlaw |
| 2011/0238941 A1 | 9/2011 | Xu et al. |
| 2011/0298512 A1 | 12/2011 | Kwak |
| 2011/0314324 A1 | 12/2011 | Ozdemir |
| 2012/0084575 A1 | 4/2012 | Flores et al. |
| 2012/0124317 A1 | 5/2012 | Mirichigni et al. |
| 2012/0212268 A1 | 8/2012 | Kim |
| 2013/0141994 A1 | 6/2013 | Ito et al. |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2014/0010025 A1 | 1/2014 | Bringivijayaraghavan |
| 2014/0035640 A1 | 1/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0258764 A1 | 9/2014 | Kwak |

OTHER PUBLICATIONS

Related U.S. Appl. No. 13/074,972, filed Mar. 29, 2011.
Related U.S. Appl. No. 13/093,640, filed Apr. 25, 2011.
Related U.S. Appl. No. 13/364,198, filed Feb. 1, 2012.
Related U.S. Appl. No. 13/486,674, filed Jun. 1, 2012.
"Interfacing DDR SDRAM with Stratix II Devices", Version 3.2, Altera Corp, Sep. 2008.
Lee, "How to Implement DDR SGRAM in Graphic System", Samsung Electric, 1998.
Related U.S. Appl. No. 13/592,244, filed Aug. 22, 2012.

* cited by examiner

US 9,054,675 B2

APPARATUSES AND METHODS FOR ADJUSTING A MINIMUM FORWARD PATH DELAY OF A SIGNAL PATH

TECHNICAL FIELD

Embodiments of the invention relate generally to semiconductor memory, and more specifically, in one or more described embodiments, to signal paths and adjusting the timing of command signals through the signal path.

BACKGROUND OF THE INVENTION

In semiconductor memory, proper operation of the memory is based on the correct timing of various internal command and clock signals. For example, in reading data from the memory, internal clock signals that clock data path circuitry to provide (e.g. output) the read data may need to be provided substantially concurrently with internal read command signals to properly enable the data path circuitry to output the read data. If the timing of the internal read command signal is not such that the data path circuitry is enabled at the time the internal clock signal clocks the data path circuitry to output the read data at an expected time, the read command may be inadvertently ignored or the read data provided by the memory may not be correct (e.g., the data associated with another read command). Likewise, in writing data to memory internal clock signals that clock data path circuitry to latch write data may need to be provided with specific timing relationships with internal write command signals to properly enable the data path circuitry to provide the latched write data for writing to memory. Inaccurate timing of the internal command and clock signals could result in the write command being inadvertently ignored or incorrect write data being provided to the memory may (e.g., the write data is associated with another write command). Another example of a command that may require the correct timing of internal clock signals and the command for proper operation include, for example, on-die termination enable commands.

Moreover, as known, a "latency" may be selected (e.g., programmed, desired, used, given, etc.) to set a time, typically in numbers of clock periods tCK, between receipt of a read command by the memory and when the data is output by the memory. A "write latency" may also be selected to set a time, also typically in numbers of tCK, between receipt of a write command by the memory and when the write data is provided to the memory. The latencies may be selected, for example, to accommodate clock signals of different frequencies (i.e., different clock periods).

Complicating the generating of correctly timed internal clock and command signals is the relatively high frequency of memory clock signals. For example, memory clock signals can exceed 1 GHz. Further complicating the matter is that multi-data rate memories may provide and receive data at a rate higher than the memory clock signal, which may represent the rate at which commands may be executed. As a result, the timing domains of command and clock signals may need to be crossed in order to maintain proper timing. An example of a multi-data rate memory is one that outputs read data at a rate twice that of the clock frequency, such as outputting data synchronized with clock edges of the memory clock signal. Further complicating the timing of internal clock and command signals with relatively high frequency clock signals is minimum forward path delay through a signal path. That is, in some instances, the minimum forward path delay of a signal path may prevent internal command signals from being provided for operation according to a selected latency.

An example conventional approach of timing internal command and clock signals is modeling both the clock path and the command path to have the same propagation delay. This may require, however, that delays and/or counter circuitry run continuously. As a result, power consumption may be higher than desirable. Additionally, the propagation delay of the various internal clock and command paths can often vary due to power, voltage, and temperature conditions. For clock and command paths having relatively long propagation delay or additional delay circuitry, the variations due to operating conditions may negatively affect the timing of the internal signals to such a degree that the memory does not operate properly.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
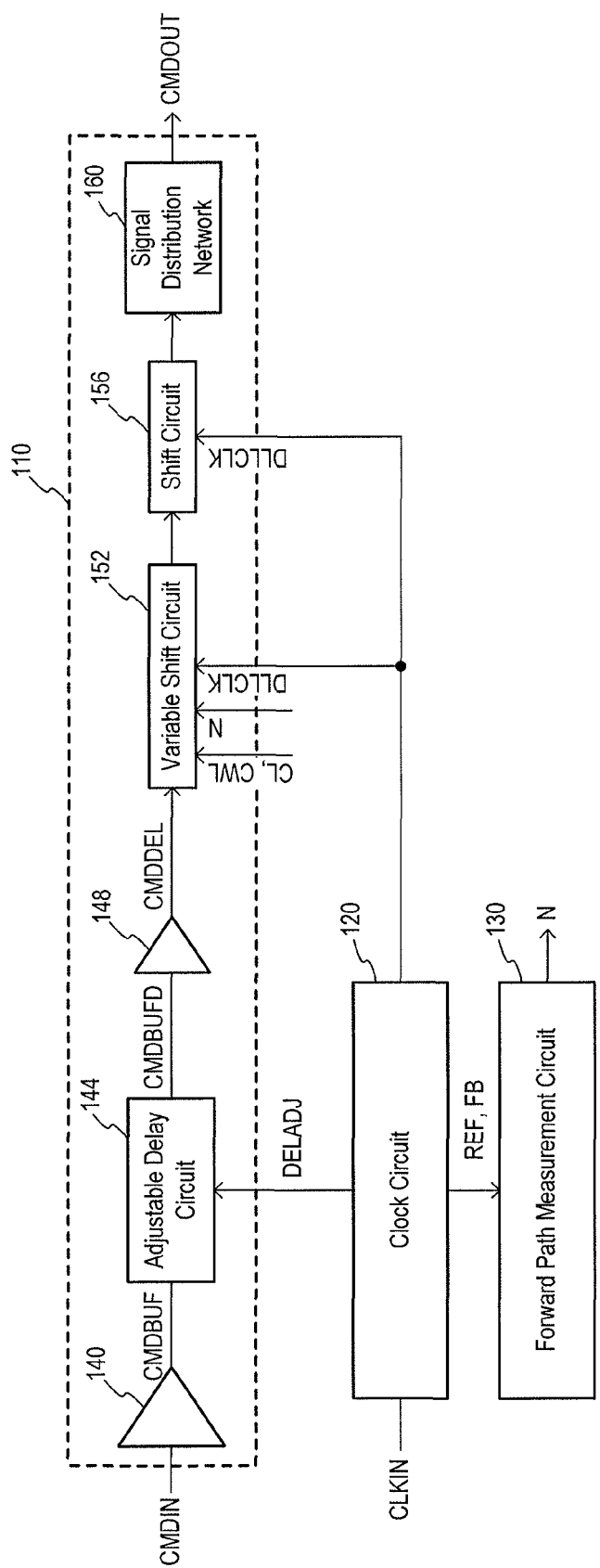
FIG. 1 is a block diagram of an apparatus including a signal path.

FIG. 1 illustrates an apparatus that includes a signal path 110, clock circuit 120, and forward path measurement circuit 130. As used herein, an "apparatus" can refer to, for example, circuitry, a semiconductor die, a device, or a system. The signal path 110 is configured to receive a signal, for example, a command signal CMDIN as shown in FIG. 1, and propagate the CMDIN signal to provide an output signal, such as output command signal CMDOUT. The CMDIN signal may represent a memory command, for example, a read command, write command, on-die termination (ODT) command, or other memory command, and may include one or several signals. The signal path 110 should have a propagation delay to accommodate (e.g., satisfy) a selected latency, for example CAS latency CL or CAS write latency CWL. In this manner, a CMDIN signal may be propagated to a circuit that may, for example, be enabled by the resulting CMDOUT signal at an appropriate time according to the selected latency. As will be described in more detail below, the signal path 110 includes an adjustable delay circuit 144 (e.g., an adjustable delay line) to provide an adjustable delay (not shown) to the propagation delay of the signal path 110. The signal path 110 may further include a variable shift circuit 152 to provide additional clock cycles of time in order to have a propagation delay that accommodates the selected latency. As previously discussed, the latency may be selected to accommodate clock signals of different frequencies, for example. The latency may be selected dynamically (e.g., during operation or power-up), and in other embodiments, the latency may be selected statically (e.g., at a time of manufacturing or assembly).

The clock circuit 120 is configured to provide a clock signal DLLCLK having a delayed phase relationship to an input clock signal CLKIN. The delay added to the CLKIN signal is adjustable and adjusted to be an amount suitable to substantially synchronize an operation to the CLKIN signal. The DLLCLK signal is provided to the signal path 110, and a delay adjustment signal DELADJ is provided as well. The DELADJ signal may result from determining a suitable amount of delay to add to the CLKIN signal in providing a DLLCLK signal for synchronous operation. The DELADJ signal may be based at least in part on a delay adjustment made in the clock circuit 120. In some embodiments, the DELADJ signal may reflect an amount of adjustable delay added to the CLKIN signal in providing the DLLCLK signal. An example of a clock circuit that may be used for the clock circuit 120 is a delay-locked loop (DLL). Other clock circuits may be used as well.

The forward path measurement circuit 130 is configured to measure a minimum forward path delay for the signal path 110. The forward path delay of the signal path 110 is the propagation delay of the signal path 110. A minimum forward path delay results from the inherent propagation delays of circuits in the signal path 110, and without any additional delay that may be added. As previously discussed, additional delay may be added to adjust the timing of a signal propagating through the signal path 110, as well as to provide the signal path 110 with a propagation delay to accommodate a selected latency. The forward path measurement circuit 130 provides a count N of clock cycles that is representative of the minimum forward path delay of the signal path 110. In some embodiments, for example, the embodiment of FIG. 1, the N count provided by the forward path measurement circuit 130 is based on signals from the clock circuit 120. The N count may be stored after determination for later use. The N count may be stored by the forward path measurement circuit 130, or by other circuitry.

The signal path 110 of the apparatus of FIG. 1 includes a buffer 140 configured to buffer an input signal, for example, a command signal CMDIN, and provide the buffered CMDIN signal CMDBUF to an adjustable delay circuit 144. The adjustable delay circuit 144 provides a delayed CMDBUFD signal having a delay relative to the CMDBUF signal that is based on a delay adjustment signal DELADJ. The delayed CMDBUFD signal is provided to a buffer 148, which is configured to provide a buffered CMDBUFD signal CMDDEL to a variable shift circuit 152. The variable shift circuit 152 is provided a selected latency (e.g., CL and/or CWL), and further provided the N count and the DLLCLK signal. The latency may be defined by a number of clock cycles, for example, of the CLKIN signal. The variable shift circuit 152 is configured to shift commands represented by the CMDDEL signal by a number of clock cycles of the DLLCLK signal based at least in part on the latency and the N count. An adjustment factor may also be considered. For example, in some embodiments of the invention, the variable shift circuit 152 shifts commands (CWL-N-4) clock cycles of the DLLCLK signal for write commands and ODT commands, where 4 is the adjustment factor. In some embodiments, the variable shift circuit 152 shifts commands (CL-N-3) clock cycles of the DLLCLK signal for read commands, where 3 is the adjustment factor. In other embodiments, other adjustment factors may be used as well. The shifted CMDDEL signal is provided to a shift circuit 156 configured to shift the CMDDEL signal one clock cycle of the DLLCLK signal before being provided to a signal distribution network 160. The signal distribution network 160 provides (e.g., distributes) the CMDDEL signal to various circuits that may rely on the CMDDEL signal to operate.

In operation, a command represented by the CMDIN signal is provided to the signal path 110 and propagated through the buffer 140, adjustable delay circuit 144, buffer 148, and shift circuits 152, 156 to the signal distribution network 160. The variable shift circuit 152 adds clock cycles of the DLLCLK signal to the propagating CMDIN signal to provide a resulting propagation delay for the signal path 110 that will accommodate the selected latency.

Figure 2:
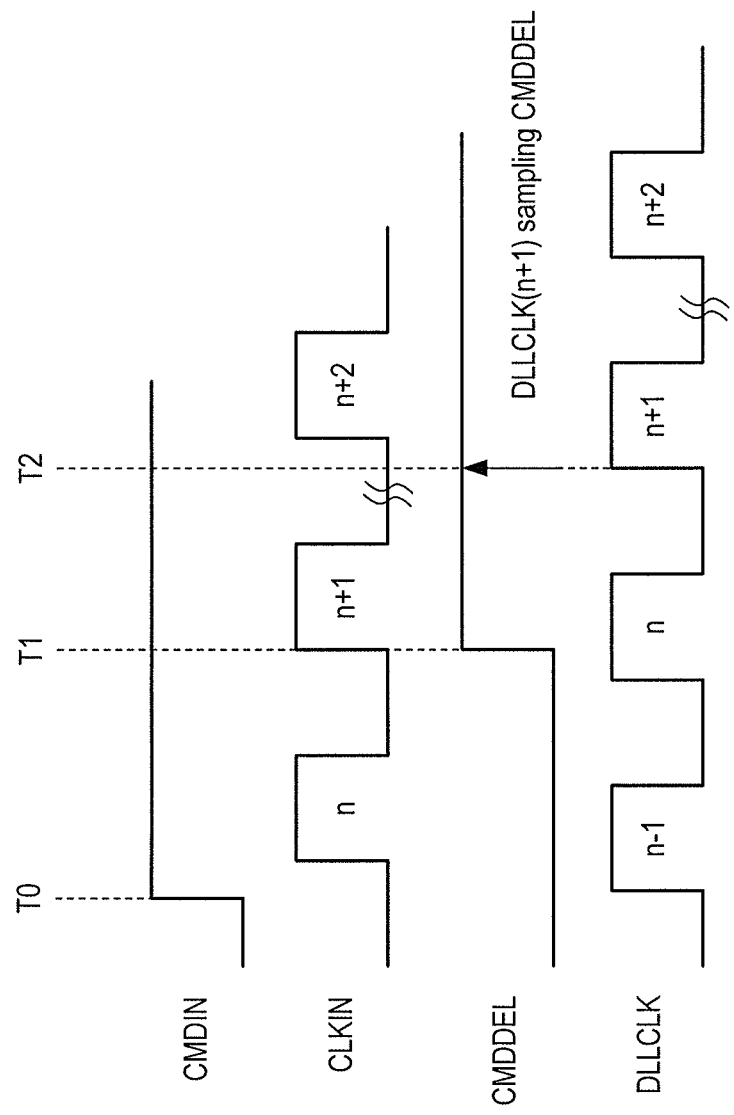
FIG. 2 is a timing diagram of various signals during operation of the signal path of FIG. 1.

FIG. 2 illustrates various signals during operation of the signal path 110 according to an embodiment of the invention. At time T0 a CMDIN signal becomes active, representing a memory command to be received by the memory. As previously described, the CMDIN signal propagates through the buffer 140, the adjustable delay circuit 144, and the buffer 148 to provide a CMDDEL signal. The CMDDEL signal is illustrated in FIG. 2 as having a rising edge at time T1 which corresponds to the active CMDIN signal at time T0. The delay between times T0 and T1 represent the propagation delay through the buffer 140, the adjustable delay circuit 144, and the buffer 148.

At time T2 an (n+1)-pulse of the DLLCLK signal has a rising edge corresponding to a rising edge of the (n+1)-pulse of the CLKIN signal. The (n+1)-pulse of the DLLCLK signal latches (e.g., captures) the CMDDEL signal in the variable shift circuit 152. The DLLCLK signal clocks the variable shift circuit 152 to further delay the CMDDEL signal by a number of clock cycles of the DLLCLK to provide a resulting propagation delay for the signal path 110 that will accommodate the selected latency As previously discussed, the number of additional clock cycles added to a command propagating through the signal path 110 may be based at least in part on a selected latency (e.g., CL and/or CWL) and the N count. An adjustment factor may also be considered. As also previously discussed, examples of calculating the number of additional clock cycles from at least CL/CWL and the N count are (CWL-N-4) clock cycles of the DLLCLK signal for write commands and ODT commands, and (CL-N-3) clock cycles of the DLLCLK signal for read commands. It can be seen from the example calculations of additional clock cycles that the number of additional clock cycles may be negative for some combinations of latency and N count. Generally, such situations may occur where the selected latency (in number of clock cycles) is low and the N count is high (e.g., the clock frequency is relatively high resulting in a relatively high N count for the minimum forward path delay of the signal path 110).

A maximum N count Nmax may be calculated for various latencies at which the number of additional clock cycles becomes negative. For example, using the example calculation with reference to CWL:

| CWL | | | | | |
|---|---|---|---|---|---|
| 5 | 6 | 7 | 8 | 9 | 10 |
| Nmax 1 | 2 | 3 | 4 | 5 | 6 |

With reference to CL:

| CL | | | | | |
|---|---|---|---|---|---|
| 5 | 6 | 7 | 8 | 9 | 10 |
| Nmax 2 | 3 | 4 | 5 | 6 | 7 |

In some embodiments of the invention, when an Nmax for a respective latency is exceeded, a signal path may be adjusted (e.g., modified, altered, changed, etc.) to provide a reduced (e.g., decreased, shorter, etc.) minimum forward path delay. As a result, an N count greater than Nmax for a respective latency may be accommodated.

Figure 3:
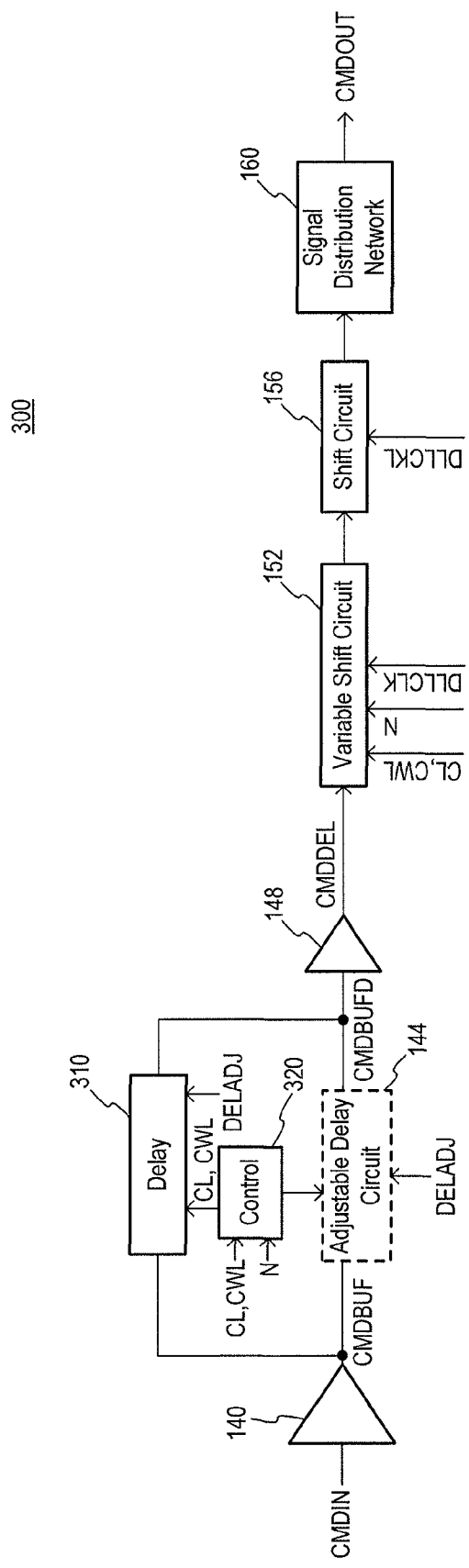
FIG. 3 is a block diagram of a signal path according to an embodiment of the invention.

FIG. 3 illustrates a signal path 300 according to an embodiment of the invention. The signal path 300 is similar to the signal path 110 of FIG. 1 and may include similar components. Those similar components are referenced in FIG. 3 using the same reference number as in FIG. 1, and operation of the components may also be similar. As such, the similar components and their operation will not be described in detail again in the interest of brevity.

In addition to a buffer 140, an adjustable delay circuit 144, a buffer 148, a variable shift circuit 152, a shift circuit 156, and a signal distribution network 160, the signal path 300 further includes a delay circuit 310 coupled to buffers 140 and 148 and delay control logic 320 coupled to the delay circuit 310 and adjustable delay circuit 144. The delay control logic 320 is provided the selected latency (e.g., CL and/or CWL) and the N count. The control logic 320 is configured to cause the delay circuit 310 to delay the buffered CMDIN signal CMDBUF from the buffer 140 when the N count exceeds the Nmax for a respective latency, rather than having the CMDBUF signal delayed by the delay of the adjustable delay circuit 144. The delay circuit 310 is provided the DELADJ signal and the selected latency (e.g., CL and/or CWL). The selected latency may be provided by the control logic 320, as in the embodiment of FIG. 3, or may be provided directly to the delay circuit 310 as well. The delay provided by the delay circuit 310 is typically less than the delay provided by the adjustable delay circuit 144. As a result, the minimum forward path delay of the signal path 300 through the delay circuit 310 is less than the minimum forward path delay through the adjustable delay circuit 144, and may accommodate N counts greater than Nmax. In the embodiment of FIG. 3, the delay may be based at least in part on the selected latency and the DELADJ signal, however, the scope of the present invention is not limited to this particular embodiment.

In some embodiments, the CMDBUF signal is delayed through the delay circuit 310 rather than through the adjustable delay circuit 144 by disabling the adjustable delay circuit when the N count is greater than Nmax. In other embodiments, the CMDBUF signal may be provided to the delay circuit 310 and not to the adjustable delay circuit 144, for example, through switches or logic (not shown).

Figure 4:
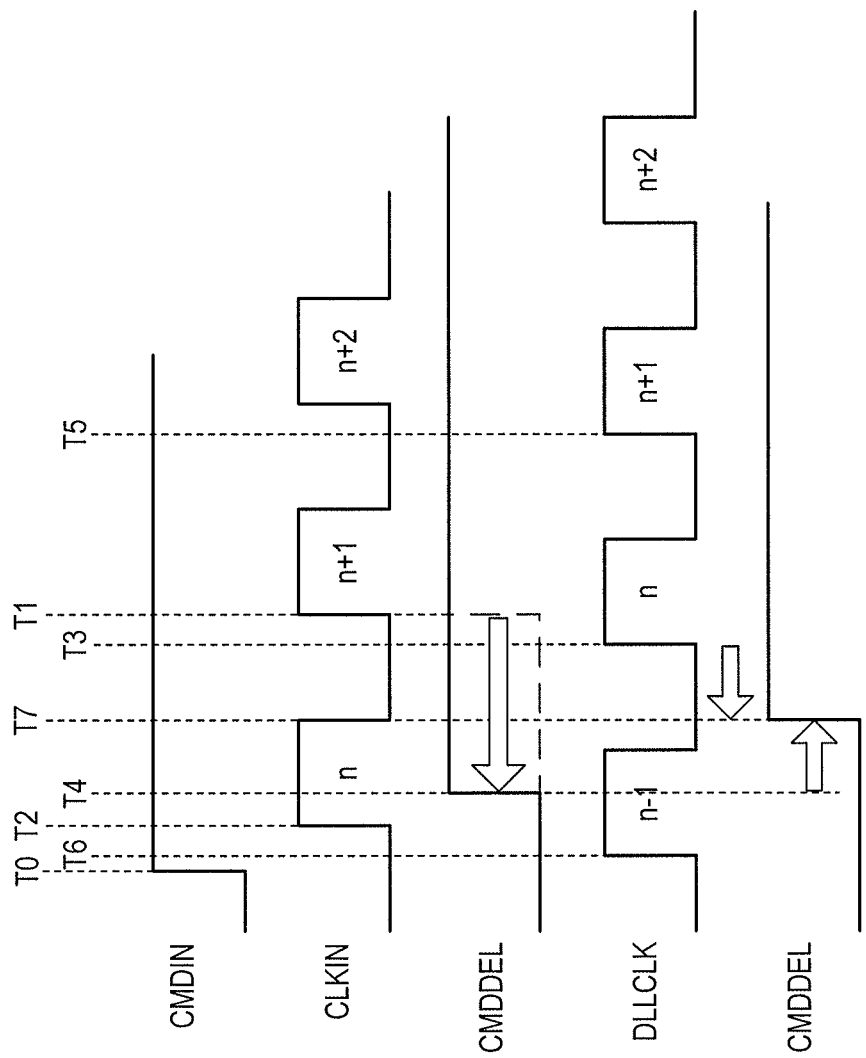
FIG. 4 is a timing diagram of various signals during operation of the signal path of FIG. 3 according to an embodiment of the invention.

FIG. 4 illustrates various signals during operation of the signal path 300 according to an embodiment of the invention. At time T0 a CMDIN signal becomes active, representing a memory command received by the signal path 300. The CMDIN signal is latched responsive to a rising edge of an n-pulse of the CLKIN signal at time T2. As previously described, the CMDIN signal propagates through the buffer 140, the adjustable delay circuit 144, and the buffer 148 to provide a CMDDEL signal. The CMDDEL signal is illustrated in FIG. 4 as having a rising edge at time T1 (shown in dashed line), which corresponds to the latched active CMDIN signal at time T2. The delay between times T2 and T1 represent the propagation delay of the CMDIN signal before being output by the buffer 148 as the CMDDEL signal. A DLLCLK signal is provided by a clock circuit, for example, the clock circuit 120 of FIG. 1, having a delay relative to the CLKIN signal so that operation is substantially synchronized to the CLKIN signal. The delay is represented in FIG. 4 as the time between times T2 and T3. In a situation wherein the N count is less than or equal to Nmax for a selected latency, an (n+1)-pulse at time T5 is used to latch the CMDDEL signal in the variable shift circuit 152, as for the signal path 110 of FIG. 1.

In order to accommodate a situation when the N count is greater than Nmax for a selected latency, the minimum forward path delay may be reduced. In some embodiments, the minimum forward path delay is reduced by removing the propagation delay of the adjustable delay circuit 144. Shown in FIG. 4 is the CMDDEL signal without the propagation delay of the adjustable delay circuit 144. In particular, the rising edge of the CMDDEL signal occurs sooner at time T4 rather than at time T1, which as previously described, includes the propagation delay of the adjustable delay circuit 144. By reducing the minimum forward path delay, the CMDDEL signal may be latched earlier, for example, with the n-pulse of the DLLCLK signal rather than with the (n+1)-pulse. In effect, the minimum forward path delay is reduced by a clock cycle of the DLLCLK signal.

Removing the propagation delay of the adjustable delay circuit 144, however, may reduce the minimum forward path delay of the signal path 300 by an amount that may result in the (n−1)-pulse at time T6 unintentionally latching the CMDDEL signal, that is, one clock cycle earlier than expected. This may result in erroneous operation. A delay less than the propagation delay of the adjustable delay circuit 144 may be added to the minimum forward path delay to delay the CMDDEL signal to provide sufficient margin to avoid unintentionally latching the CMDDEL signal earlier than expected, but still allowing the CMDDEL signal to be active early enough so that the n-pulse at time T3 may be used to latch the CMDDEL signal into the variable shift circuit 152. The delay circuit 310 may be used to provide this delay. Illustrated in FIG. 4 is an example CMDDEL signal having such a delay, which is shown having a rising edge at time T7, which is sufficiently delayed to avoid being unintentionally latched by the (n−1)-pulse at time T6, but sufficiently early to be safely latched by the n-pulse at time T3. The delay provided by the delay circuit 310 is represented by the time between times T4 and T7.

In some embodiments, the delay added to the minimum forward path delay (without the propagation delay of the adjustable delay circuit 144) should be different for different latencies. As known, a latency is often selected based on a frequency of the CLKIN signal, for example, a longer latency may be selected for higher CLKIN frequencies, and conversely, a lower latency may be selected for a lower CLKIN frequency. The CLKIN frequency may affect the amount of delay added to the CLKIN signal to provide the DLLCLK signal (e.g., by a clock circuit). As previously discussed, an amount of adjustable delay added by the clock circuit in providing the DLLCLK signal may be represented by the DELADJ signal. As such, the amount of delay added to the minimum forward path delay, for example, by the delay circuit 310 may be different for different latencies.

Figure 5:
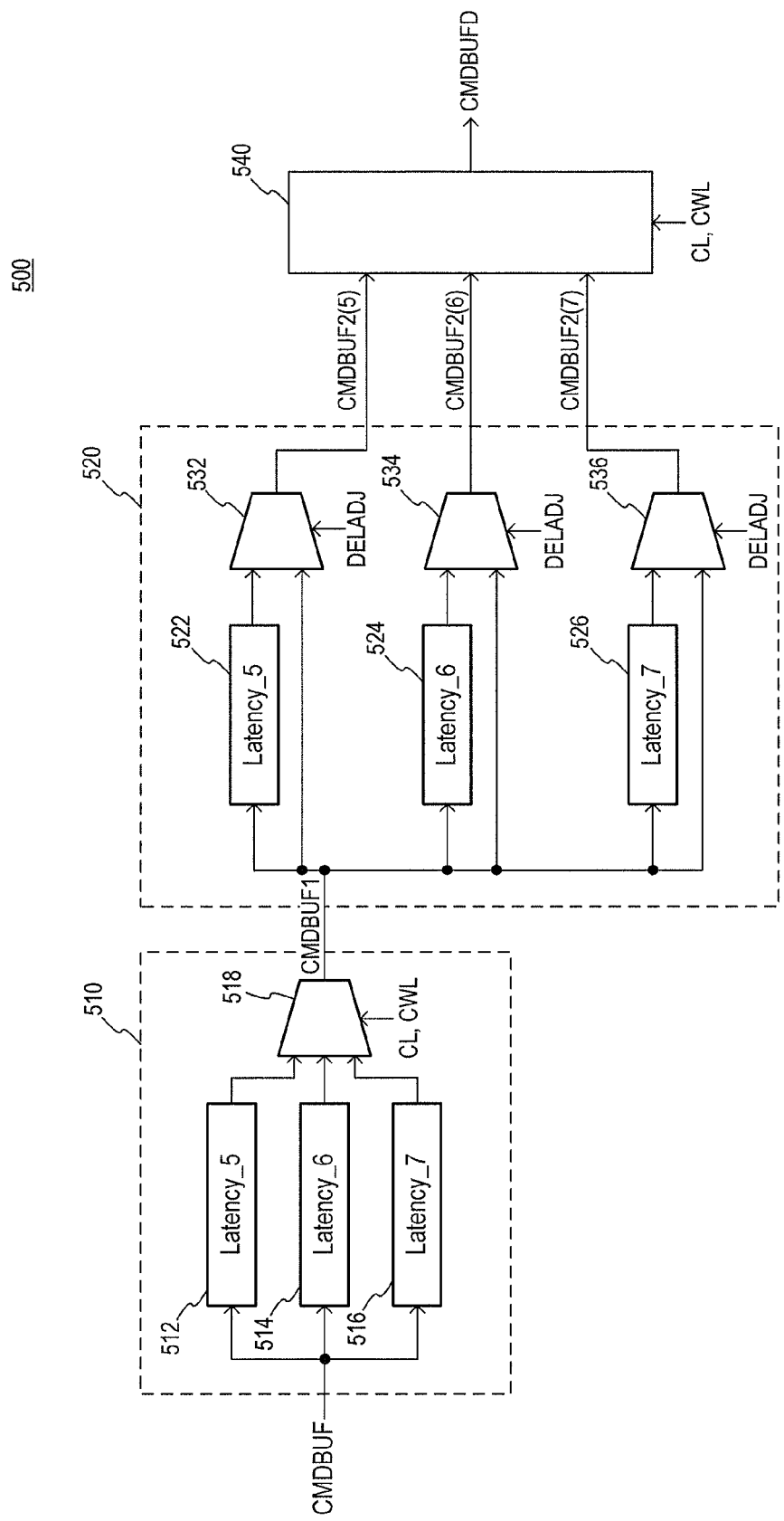
FIG. 5 is a block diagram of a delay tree according to an embodiment of the invention.

FIG. 5 illustrates a delay tree 500 according to an embodiment of the invention. The delay tree 500 may be included in the delay circuit 310, for example, to add the appropriate delay to the minimum forward path delay. The delay tree 500 includes a delay stage 510 configured to provide a first delay, a delay stage 520 to provide a second delay, and a multiplexer 540 configured to provide a CMDBUFD signal, which as previously discussed may be provided to a buffer, such as buffer 148. The delay stage 510 includes delays 512, 514, 516 each configured to provide a delay to the CMDBUF signal associated with a respective latency. For example, the delay 512 may delay the CMDBUF signal by a first delay, the delay 514 may delay the CMDBUF signal by a second delay, and the delay 516 may delay the CMDBUF signal by a third delay. A multiplexer 518 is used to select one of the delayed CMDBUF signals based on the selected latency to be provided as a CMDBUF1 signal to the delay stage 520. The delays provided by each of the delays 512, 514, 516 may be different, or in some embodiments, two or more of the delays may provide the same delay to the CMDBUF signal.

The CMDBUF1 signal provided to the delay stage 520 is further delayed by delays 522, 524, 526 before being provided to a respective multiplexer 532, 534, 536. The CMDBUF1 signal is also provided to the multiplexers 532, 534, 536 without adding delay. Selection of the delayed or undelayed signal by each of the multiplexers 532, 534, 536 to be provided as a respective CMDBUF2 signal to the multiplexer 540 is based at least in part on the amount of delay added to the CLKIN signal to provide the DLLCLK signal. For example, the multiplexers 532, 534, 536 select the delayed signal when the delay added to the CLKIN signal is relatively long and select the undelayed signal when the delay added to the CLKIN signal is relative short. In some embodiments, the amount of delay added to the CLKIN signal may represented by the DELADJ signal from the clock circuit (e.g., clock circuit 120).

The delay length of each delay 512, 514, 516, and delays 522, 524, 526 may be based, for example, on the number of delay units in an adjustable delay of the clock circuit, the delay length of each delay unit, and the range of clock frequencies of CLKIN that may be provided. Other factors may be considered as well. Generally, however, the total delay provided through the delays 512, 514, 516, and delays 522, 524, 526 should be a non-zero delay that is less than the propagation delay of the adjustable delay circuit 144.

The CMDBUF2 signals are provided to the multiplexer 540 which selects one of the CMDBUF2 signals to be provided as the CMDBUFD signal based at least in part on the selected latency. For example, the CMDBUF2(5) signal provided by the multiplexer 532 may be selected by the multiplexer 540 to be provided as the CMDBUFD signal when a first latency is selected, the CMDBUF2(6) signal provided by, the multiplexer 534 may be selected when a second latency is used, and the CMDBUF2(7) signal provided by the multiplexer 536 may be selected when a third latency is selected.

In operation, a CMDBUF signal is delayed by the delays 512, 514, 516, one of which is selected by the multiplexer 518 to be provided as the CMDBUF1 signal based on the selected latency. The selected signal is provided to the delay stage 520 and delayed by the delays 522, 524, 526 and provided to respective multiplexers 532, 534, 536. The undelayed CMDBUF1 signal is also provided to the multiplexers 532, 534, 536. Each of the multiplexers 532, 534, 536 provide the respective delayed signal or undelayed signal as a respective CMDBUF2 signal based on the amount of delay added to the CLKIN signal to provide the DLLCLK signal (e.g., as represented by the DELADJ signal). Generally, the delayed signal is selected when the delay added to the CLKIN signal is relatively long. The CMDBUF2 signals are provided to the multiplexer 540 to be selected and provided as the CMDBUFD signal based on the selected latency. The selected CMDBUF2 signal will be delayed by an appropriate amount to provide sufficient margin to avoid being unintentionally latched earlier than expected but early enough to be latched one clock pulse earlier.

Figure 6:
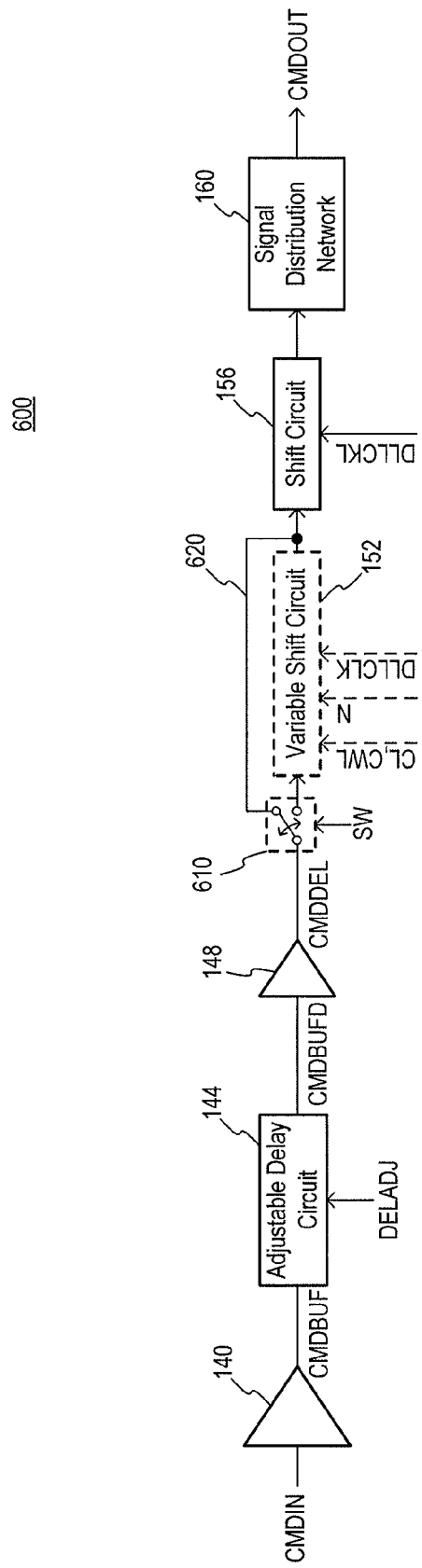
FIG. 6 is a block diagram of a signal path according to an embodiment of the invention.

FIG. 6 illustrates a signal path 600 according to an embodiment of the invention. The signal path 600 is similar to the signal path 110 of FIG. 1 and may include similar components. Those similar components are referenced in FIG. 6 using the same reference number as in FIG. 1, and operation of the components may also be similar. As such, the similar components will not be described in detail again in the interest of brevity.

In addition to a buffer 140, an adjustable delay circuit 144, a buffer 148, a variable shift circuit 152, a shift circuit 156, and a signal distribution network 160, the signal path 600 further includes a switch circuit 610 and bypass path 620. A controller (not shown) may provide the SW signal to the switch circuit 610. The switch circuit 610 is controlled by a switch signal SW to provide the CMDDEL signal to the variable shift circuit 152 or to the bypass path 620. The switch circuit 610 provides the CMDDEL signal to the bypass path 620 to bypass the variable shift circuit 152 when the N count exceeds the Nmax for a selected latency, thereby removing any propagation delay through the variable shift circuit 152 from the signal path 600. The variable shift circuit 152 may have a minimum propagation delay of one clock cycle. As a result of removing the propagation delay of the variable shift circuit 152, the forward path delay of the signal path 600 is reduced by the propagation delay of the variable shift circuit 152. In order to accommodate a situation when the N count is greater than Nmax for a selected latency, the minimum forward path delay may be reduced. In some embodiments, the minimum forward path delay is reduced by bypassing the variable shift circuit 152. By reducing the minimum forward path delay, the CMDDEL signal may be provided to the signal distribution network 160 earlier, for example, by a clock cycle of the DLLCLK signal.

Figure 7:
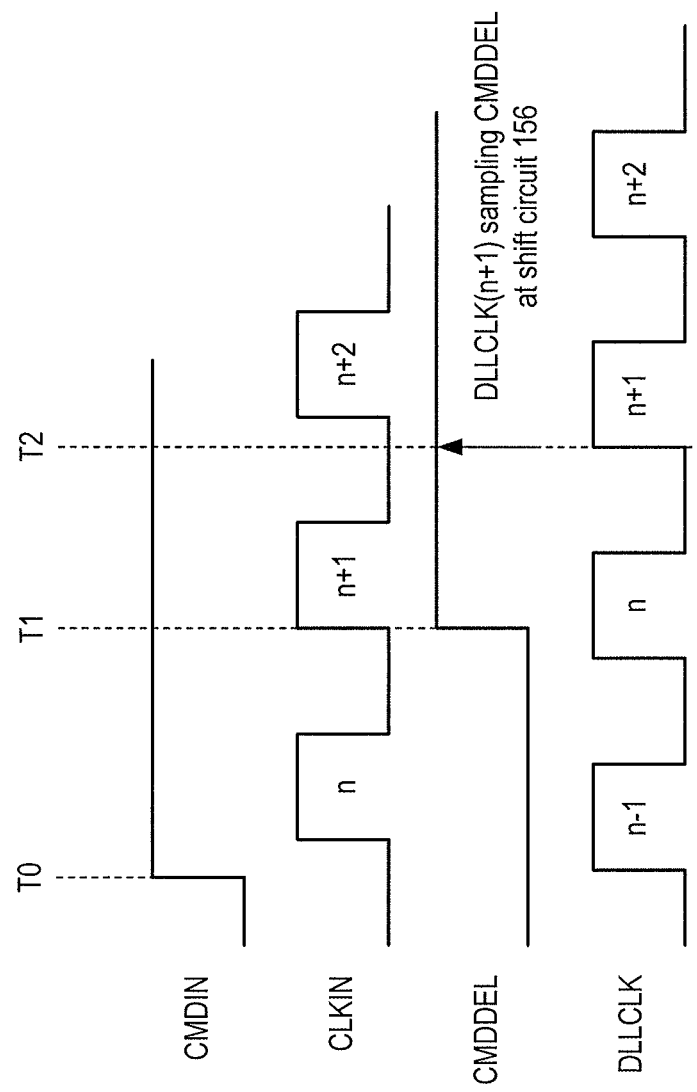
FIG. 7 is a timing diagram of various signals during operation of the signal path of FIG. 6 according to an embodiment of the invention.

FIG. 7 illustrates various signals during operation of the signal path 600 according to an embodiment of the invention. At time T0 a CMDIN signal becomes active, representing a memory command to be received by the memory. As previously described, the CMDIN signal propagates through the buffer 140, the adjustable delay circuit 144, and the buffer 148 to provide a CMDDEL signal. The CMDDEL signal is illustrated in FIG. 7 as having a rising edge at time T1 which corresponds to the active CMDIN signal at time T0. The delay between times T0 and T1 represent the propagation delay through the buffer 140, the adjustable delay circuit 144, and the buffer 148.

At time T2 an (n+1)-pulse of the DLLCLK signal has a rising edge corresponding to a rising edge of the (n+1)-pulse of the CLKIN signal. As previously discussed with reference to FIG. 2, the (n+1)-pulse of the DLLCLK signal latches the CMDDEL signal in the variable shift circuit 152 when it is not bypassed, such as when the N count is not greater than Nmax. However, assuming for the sake of example that the N count is greater than Nmax for a selected latency, the switch circuit 610 provides the CMDDEL signal to the bypass path 620 to bypass the variable shift circuit 152, and the CMDDEL signal is provided to the shift circuit 156. As a result, the (n+1)-pulse of the DLLCLK signal latches the CMDDEL signal at the shift circuit 156, rather than the (n+1)-pulse of the DLLCLK signal at the variable shift circuit 152. In effect, the forward path delay of the signal path 600 is reduced by one clock signal bypassing the variable shift circuit 152, and the CMD-DEL signal is latched and provided to the signal distribution network 160 one clock cycle of the DLLCLK earlier than in the case where the variable shift circuit 152 is not bypassed.

In some embodiments, a signal path may combine the embodiments of the signal path 300 of FIG. 3 and signal path 600 of FIG. 6. For example, a signal path may adjust its minimum propagation delay by using one or both of removing the adjustable delay circuit 144 from the signal path and bypassing the shift circuit 156 when the N count exceeds the Nmax for a selected latency. Whereas in some embodiments the removal of the adjustable delay circuit 144 can save one clock cycle of the DLLCLK and the bypassing of the shift circuit 156 can save one clock cycle of the DLLCLK, combining the two can result in saving two clock cycles of the DLLCLK, for example. Embodiments of the invention may also be combined with other circuits to further reduce minimum forward propagation delay of a signal path without departing from the scope of the invention.

Figure 8:
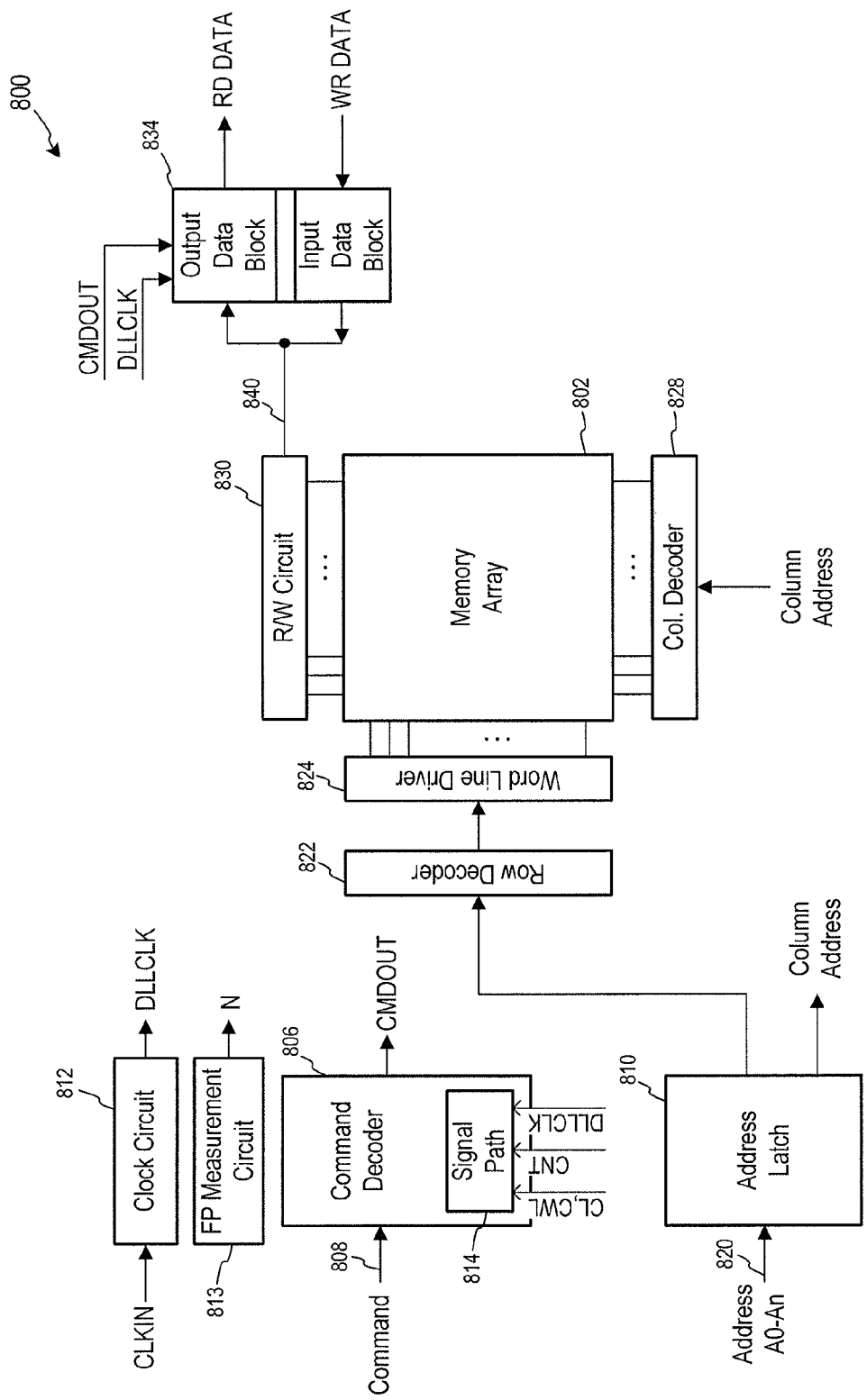
FIG. 8 is a block diagram of a memory having a signal path according to an embodiment of the invention.

FIG. 8 illustrates a portion of a memory 800 according to an embodiment of the present invention. The memory 800 includes an array 802 of memory cells, which may be, for example, DRAM memory cells, SRAM memory cells, flash memory cells, or some other types of memory cells. The memory 800 includes a command decoder 806 that receives memory commands through a command bus 808 and provides (e.g. generates) corresponding control signals within the memory 800 to carry out various memory operations. Row and column address signals are provided (e.g., applied) to the memory 800 through an address bus 820 and provided to an address latch 810. The address latch then outputs a separate column address and a separate row address.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line or bit lines) corresponding to a received column address are coupled to a read/write circuitry 830 to provide read data to an input/output data block 834 via an input-output data bus 840. Write data are provided to the memory array 802 through the I/O data block 834 and the memory array read/write circuitry 830. The I/O data block 834 may include clocked circuitry that operate responsive to an internal clock signal DLLCLK and an internal command signal CMDOUT, for example.

The memory 800 further includes clock circuit 812, forward path measurement circuit 813, and signal path 814. The clock circuit 812 receives a input clock signal CLKIN and propagates the internal clock signal DLLCLK which is based at least in part on the CLKIN signal to the I/O data block 834. The forward path measurement circuit 813 measures a forward path delay in number of clock cycles of the DLLCLK signal and provides a count N to the signal path 814. The signal path 814 further receives a latency signal CL, CWL and the DLLCLK. The signal path 814 may be configured to adjust a minimum forward path delay to accommodate circumstances when the N count is greater than a Nmax count for a latency. The signal path 814 may be implemented using a signal path according to an embodiment of the invention. The signal path 814, which is shown in FIG. 8 as being included in the command decoder 806, but is not limited to such a configuration, provides the internal command signal CMDOUT to the I/O data block 834. The command decoder 806 responds to memory commands provided to the command bus 808 to perform various operations on the memory array 802. In particular, the command decoder 806 is used to provide internal control signals to read data from and write data to the memory array 802.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a command path having a forward path delay, wherein the command path is configured to reduce the forward path delay by at least one clock cycle of a clock signal to provide a command according to a selected latency responsive to a count value representative of a propagation delay of a minimum forward path delay of the command path being greater than a maximum count value for the selected latency.

2. The apparatus of claim 1 wherein the command path comprises:
an adjustable delay circuit configured to provide a first delay based, at least in part, on a delay adjustment signal;
a delay circuit coupled in parallel to the adjustable delay circuit and configured to provide a second delay to the propagation delay; and
delay control logic coupled to the adjustable delay circuit and the delay, wherein the delay control logic is configured to cause the second delay to be provided to the propagation delay rather than the first delay responsive to the count value exceeding a maximum count for the selected latency.

3. The apparatus of claim 2 wherein the delay circuit is configured to provide a second delay based at least in part on the selected latency and the delay adjustment signal.

4. The apparatus of claim 2 wherein the delay control logic is configured to remove an adjustable delay circuit propagation delay of the adjustable delay circuit from the propagation delay when the second delay is provided to the propagation delay rather than the first delay.

5. The apparatus of claim 2 wherein the delay circuit comprises:
a first delay stage configured to provide a first stage delay based at least in part on the selected latency;
a second delay stage coupled to the first delay stage and configured to provide a plurality of delayed signals based at least in part on the delay adjustment signal; and
a multiplexer coupled to the second delay stage and configured to selectively provide one of the delayed signals from the second delay stage based at least in part on the selected latency.

6. The apparatus of claim 2 wherein the second delay provided by the delay is a non-zero delay less than a minimum delay of the adjustable delay.

7. The apparatus of claim 1 wherein the command path comprises:
a variable shift circuit configured to provide a delay based at least in part on the selected latency and the propagation delay of the minimum forward path delay; and
a bypass path coupled in parallel to the variable shift circuit and configured to provide a bypass around the variable shift circuit.

8. The apparatus of claim 7 wherein the delay provided by the variable shift circuit comprises at least a difference between the selected latency and a count representative of the propagation delay of the minimum forward path delay.

9. The apparatus of claim 1 wherein the command path is configured to propagate a command through the command path, and wherein the minimum forward path delay is reduced responsive to the propagation delay of the minimum forward path delay being greater than required to provide the command according to the selected latency.

10. An apparatus, comprising:
a clock circuit configured to provide a clock signal; and
a command path coupled to the clock circuit and configured to propagate a command through the path responsive to the clock signal, wherein the command path has a forward path delay and the command path is configured to reduce the forward path delay to less than a minimum forward path delay responsive to a count representative of a propagation delay of the minimum forward path delay exceeding a maximum count for a selected latency.

11. The apparatus of claim 10 wherein the command path comprises:
a first buffer;
an adjustable delay circuit coupled to the first buffer;
a second buffer coupled to the adjustable delay circuit;
a variable shift circuit coupled to the second buffer and configured to be clocked by the clock signal;
a shift circuit coupled to the variable shift circuit and configured to be clocked by the clock signal; and
a signal distribution network coupled to the shift circuit.

12. The apparatus of claim 11 wherein the command path is configured to bypass the variable shift circuit responsive to the count representative of the propagation delay of the minimum forward path delay exceeding the maximum count for the selected latency.

13. The apparatus of claim 11 wherein the command path is configured to bypass the adjustable delay circuit responsive to the count representative of the propagation delay of the minimum forward path delay exceeding the maximum count for the selected latency.

14. The apparatus of claim 13, further comprising a delay circuit configured to provide a delay to the minimum forward path delay responsive to the adjustable delay circuit being bypassed.

15. The apparatus of claim 11 wherein the command path is configured to disable the adjustable delay circuit responsive to the count representative of the propagation delay of the minimum forward path delay exceeding the maximum count for the selected latency.

16. The apparatus of claim 10 wherein the command path is configured to have the minimum forward path delay adjustable to latch a command propagating through the command path one clock cycle earlier.

17. The apparatus of claim 10 wherein the command path is a read command path and the selected latency is a selected CAS latency.

18. The apparatus of claim 10 wherein the command path is an on-die termination command path and the selected latency is a selected CAS write latency.

19. The apparatus of claim 10 wherein the command path is a write command path and the selected latency is a selected CAS write latency.

20. A method, comprising:
reducing a forward path delay of a command path to less than a minimum forward path delay of the command path responsive to a count representative of a propagation delay of the minimum forward path delay exceeding a maximum count for a selected latency; and
propagating a command through the command path according to the selected latency to provide a delayed command.

21. The method of claim 20 wherein reducing the minimum forward path delay comprises bypassing an adjustable delay.

22. The method of claim 20 wherein reducing the minimum forward path delay comprises disabling an adjustable delay.

23. The method of claim 20 wherein reducing the minimum forward path delay comprises removing the propagation delay of an adjustable delay.

24. The method of claim 21 wherein reducing the minimum forward path delay further comprises adding a non-zero delay to the minimum forward path delay that is less than a minimum delay of the adjustable delay.

25. The method of claim 24 wherein adding a non-zero delay to the minimum forward path delay comprises adding a delay based, at least in part, on the selected latency.

26. The method of claim 24 wherein propagating a command through the command path comprises:
clocking a variable shift circuit with a clock signal;
clocking a shift circuit with the clock signal; and
providing the command to a signal distribution network.

27. The method of claim 20 wherein reducing the minimum forward path delay comprises bypassing a variable shift circuit of the signal path.

28. A method comprising:
reducing a forward path delay of a command path by at least one clock cycle of a clock signal to provide a command according to a selected latency responsive to a count value representative of a minimum forward path delay of the command path being greater than a maximum count value for the selected latency.

29. The method of claim 28, further comprising providing a clock signal for clocking the command path.

30. The method of claim 28 wherein reducing the forward path delay of the command path causes the command to be latched one clock cycle earlier at a shift circuit of the command path.

31. The method of claim 28 wherein the forward path delay of the command path is reduced by two clock cycles.

32. The method of claim 28 wherein reducing the forward path delay of the command path comprises bypassing an adjustable delay circuit and/or a variable shift circuit of the command path.

* * * * *